(12) United States Patent
Tsai

(10) Patent No.: US 6,190,983 B1
(45) Date of Patent: Feb. 20, 2001

(54) METHOD FOR FABRICATING HIGH-VOLTAGE DEVICE

(75) Inventor: Meng-Jin Tsai, Kaohsiung (TW)

(73) Assignee: United Microelectronics Corp., Hsin-Chu (TW)

(*) Notice: Under 35 U.S.C. 154(b), the term of this patent shall be extended for 0 days.

(21) Appl. No.: 09/430,278

(22) Filed: Oct. 29, 1999

(51) Int. Cl.[7] .................................................. H01L 21/336
(52) U.S. Cl. ........................ 438/307; 438/199; 438/258
(58) Field of Search .................................. 438/307, 289, 438/299, 301, 302, 199, 258, 275; 437/21, 41, 42, 51

(56) References Cited

U.S. PATENT DOCUMENTS

| | | | |
|---|---|---|---|
| 5,686,328 | 11/1997 | Zhang et al. | 437/41 |
| 5,716,886 | 2/1998 | Wen | 438/299 |
| 5,851,886 | 12/1998 | Peng | 438/289 |
| 6,074,915 | * 6/2000 | Chen et al. | 438/258 |

\* cited by examiner

Primary Examiner—David Nelms
Assistant Examiner—Phuc T. Dang
(74) Attorney, Agent, or Firm—Harness, Dickey & Pierce, P.L.C.

(57) ABSTRACT

A method for providing triangle shapes of high-density plasma CVD film, thereby the grad and source/drain implantation can be applied in the same step, and an offset source/drain mask layer can be eliminated. A substrate is provided incorporating a device, wherein the device is defined as a high-voltage MOS region. Sequentially, a plurality of field oxides are formed on the substrate, one of the field oxides is spaced from another of the field oxides by a high-voltage MOS region. Then, a gate oxide layer is formed above the silicon substrate. Moreover, a polysilicon layer is deposited over the gate oxide layer. A photoresist layer is formed above the polysilicon layer and gate oxide layer, wherein the photoresist layer is defined and etched to form a gate. Then, the photoresist layer is removed. Consequentially, a dielectric layer is deposited and etched above the polysilicon layer by using high-density plasma CVD to result in the inherit triangle shape of high-density plasma CVD film characteristic. N-type ions are implanted into the silicon substrate to form N-type grad therein, and then N[+]-type ions only penetrate through the flat high-density plasma CVD dielectric film and not the triangle shape high-density plasma CVD film to form source/drain regions inside the N-type grad.

14 Claims, 5 Drawing Sheets

METHOD FOR FABRICATING HIGH-VOLTAGE DEVICE

BACKGROUND OF THE INVENTION

1. Field of the Invention

The present invention relates to high-voltage MOS transistors, and, more particularly, to a method for providing triangle shapes of high-density plasma CVD film, thereby the grad and source/drain implantation can be applied in the same step, and an offset source/drain mask layer can be eliminated.

2. Description of the Prior Art

As the scale of integrated circuits (ICs) has been rapidly decreased, the design and layout rule becomes more stringent. Moreover, as the integrated circuits (ICs) are fabricated to be more compact, the integration of ICs with different applications becomes indispensable.

The high voltage device can be used in TFT LCD device, in laser print head application, etc. FIG. 1A to 1D show the cross section of a conventional high-voltage MOS transistor, which usually includes a silicon substrate 100 and a gate oxide 120. Moreover, a polysilicon layer 140 is deposited over the gate oxide layer 120. A photoresist layer is formed above the polysilicon layer 140 and the gate oxide layer 120, wherein the photoresist layer is defined and etched to form a gate. Then, the photoresist layer is removed. Consequentially, N-type ions 160I are implanted into the silicon substrate 100 to form N-type grad 160 therein. Moreover, the offset source/drain mask layer 180 is formed above the silicon substrate 100, and then $N^+$-type ions 200I are implanted into the N-type grad to form source/drain region.

SUMMARY OF THE INVENTION

An object of the present invention is to substantially obviate one or more of the problems caused by limitations and disadvantages of the related art.

In accordance with the present invention, a method is provided for saving a mask process of the high-voltage MOS devices. Owing to the provided triangle shapes of high-density plasma CVD film in the high-voltage use of a method, the method can be adapted at low cost.

Another purpose of the present invention is to provide triangle shapes of high-density plasma CVD film, thereby the grad and source/drain implantation can be applied in the same step, and an offset source/drain mask layer can be eliminated.

In the embodiment, the present invention provides for saving a mask process of the high-voltage MOS devices, substantially facilitating the high-voltage MOS devices. Owing to the provided triangle shapes of high-density plasma CVD film in the high-voltage use of a method, the grad and source/drain implantation can be applied in the same step, and an offset source/drain mask layer can be eliminated. A substrate is provided incorporating a device, wherein the device is defined as a high-voltage MOS region. Sequentially, a plurality of field oxides are formed on the substrate, one of the field oxide is spaced from another of the field oxide by a high-voltage MOS region. Then, a gate oxide layer is formed above the silicon substrate. Moreover, a polysilicon layer is deposited over the gate oxide layer. A photoresist layer is formed above the polysilicon layer and the gate oxide layer, wherein the photoresist layer is defined and etched to form a gate. Then, the photoresist layer is removed. Consequentially, a dielectric layer is deposited and etched above the polysilicon layer using high-density plasma CVD to result in the inherent triangle shape of high-density plasma CVD film characteristic. N-type ions are implanted into the silicon substrate to form N-type grad therein, and then $N^+$-type ions only penetrate through the flat high-density plasma CVD dielectric film and not the triangle shape high-density plasma CVD film to form source/drain regions inside the N-type grad.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIGS. 2 to 6, the process flow of a preferred embodiment according to the present invention is depicted in cross-sectional views. These drawings show several key steps in sequential processes.

Figure 1A:
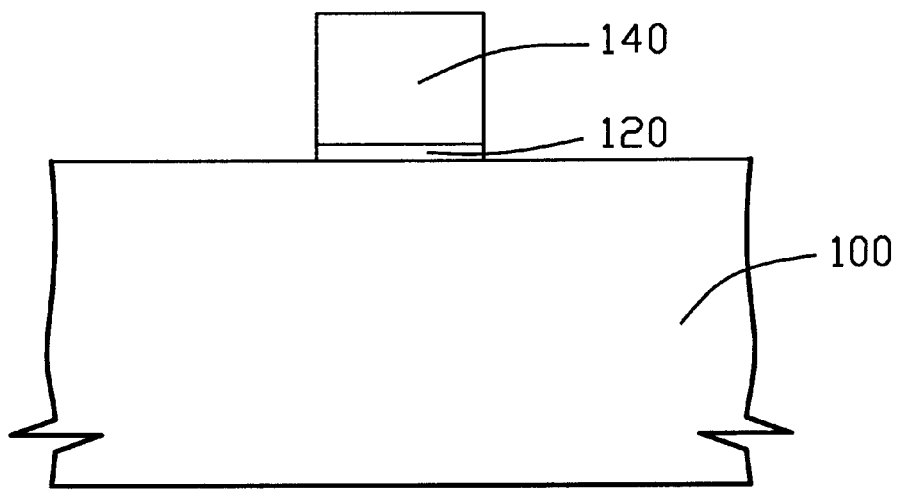
FIGS. 1A to 1D show the cross section of a conventional high-voltage metal-oxide-semiconductor transistor.
Figure 1B:
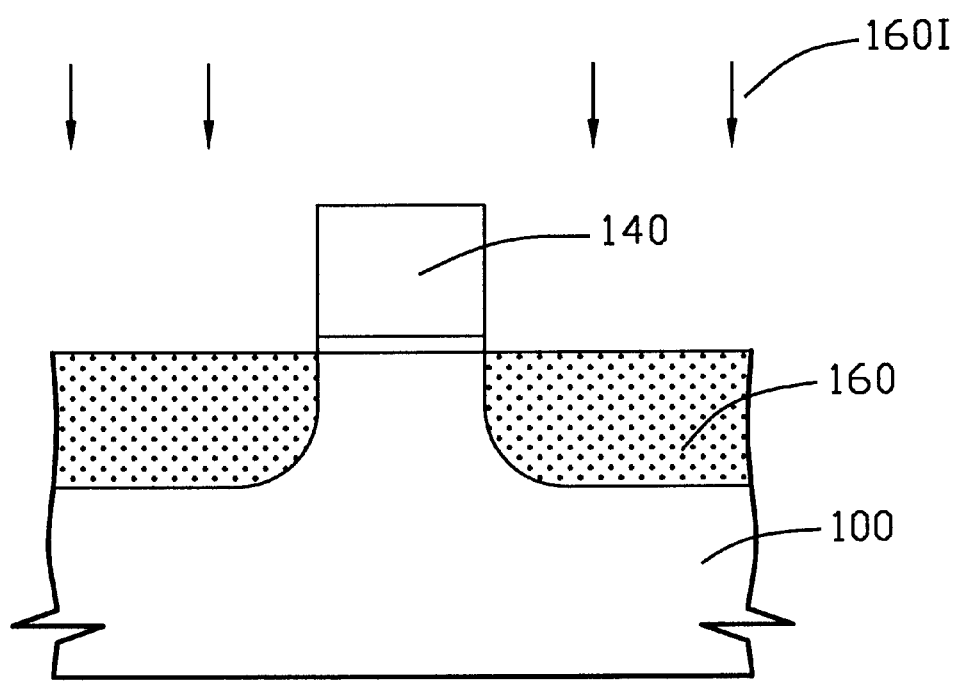
Figure 1C:
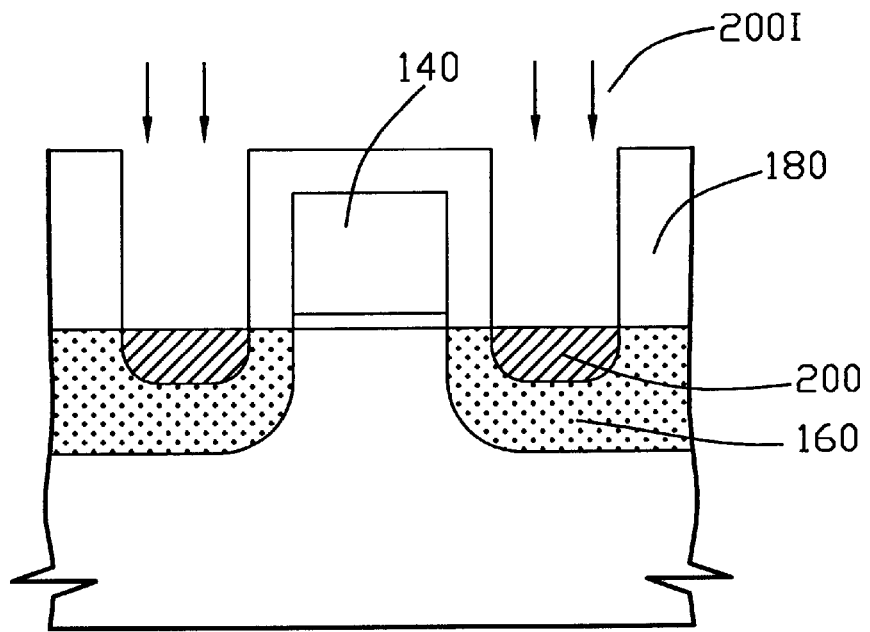
Figure 1D:
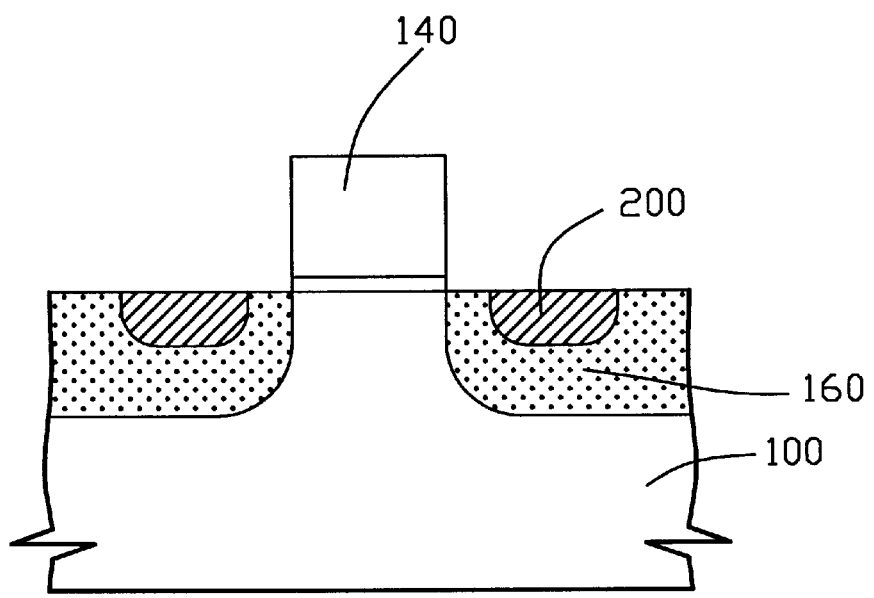
Figure 2:
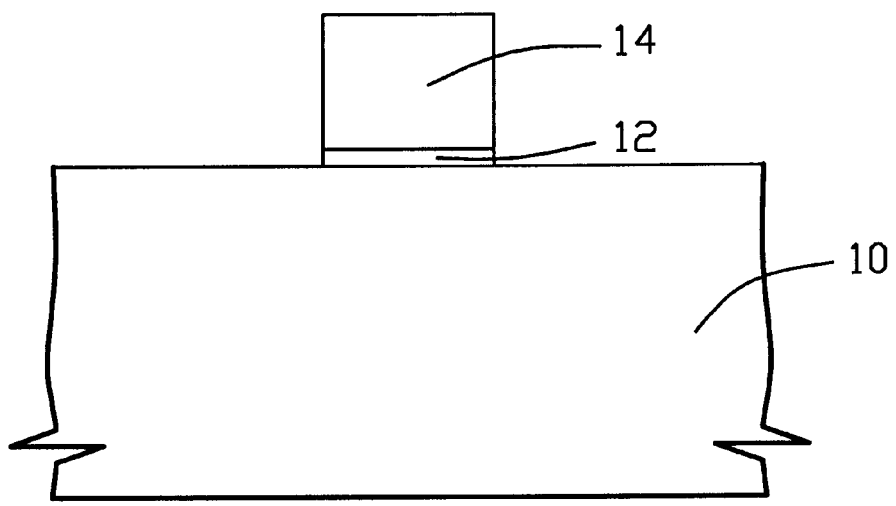
FIGS. 2 to 6 show cross-sectional views illustrative of various stages in the fabrication of a high-voltage metal-oxide-semiconductor transistor in accordance with one embodiment of the present invention.
Figure 3:
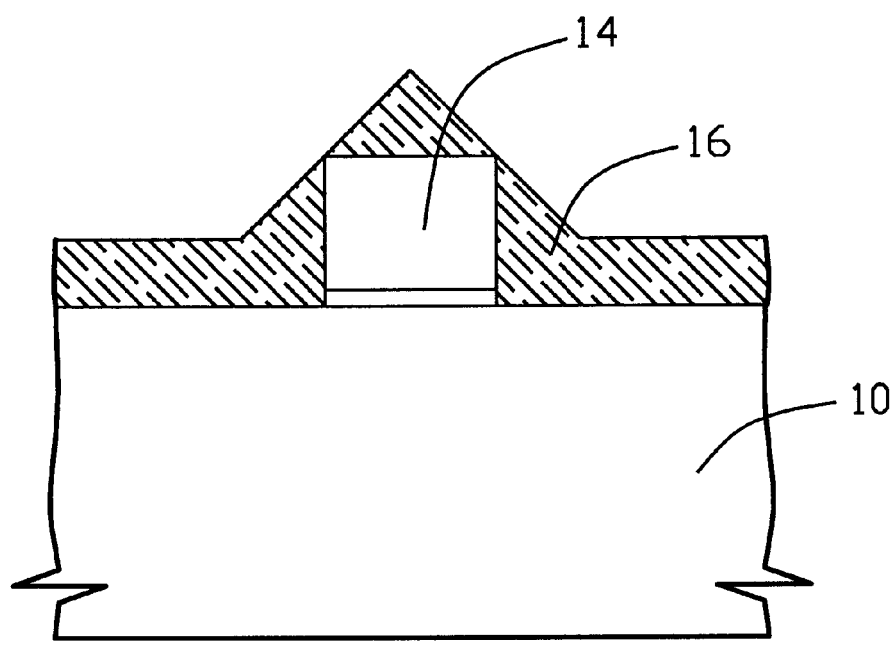

Referring to FIG. 2, a silicon substrate 10 is shown incorporating a device, wherein the device is defined as a high-voltage MOS region. A plurality of field oxides (no shown) are formed on the silicon substrate 10, one of the field oxides is spaced from another of the field oxide by a high-voltage MOS region. Consequentially, a gate oxide layer 12 having a thickness of about 100–200 angstroms is formed on the silicon substrate 10 high-voltage MOS region. A conventional thermal oxidation process preferably forms this gate oxide layer 12. Subsequently, a conventional low-pressure chemical vapor deposition (LPCVD) is utilized to form a polysilicon layer 14 on the gate oxide of high-voltage MOS region. The polysilicon layer 14 has a thickness preferably of about 3000 angstroms. Generally, the formation of the polysilicon layer 14 is implanted by doping ions, such as phosphorus or arsenic, thereunto, so that the resistivity of the gate 14 thus formed later can be substantially reduced. Sequentially, a first photoresist layer (not shown) is formed above the silicon substrate 10 of high-voltage MOS, defining and etching the first photoresist layer to form gates of high-voltage MOS. Moreover, the dielectric layer 16 is deposited and etched above the polysilicon layer 14 by using high-density plasma CVD to result in the inherit triangle shape of high-density plasma CVD film characteristic as shown in FIG. 3.

Figure 4:
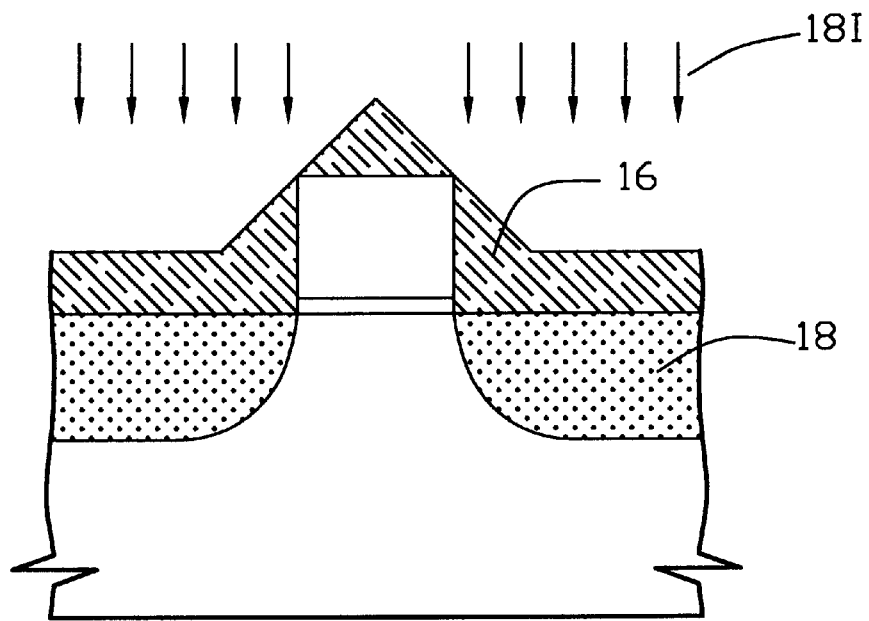
Figure 5:
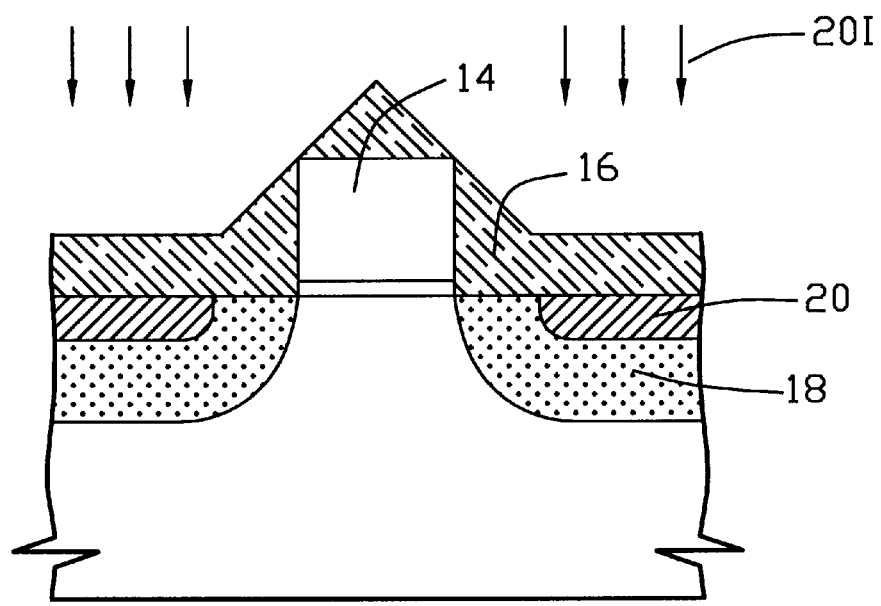
Figure 6:
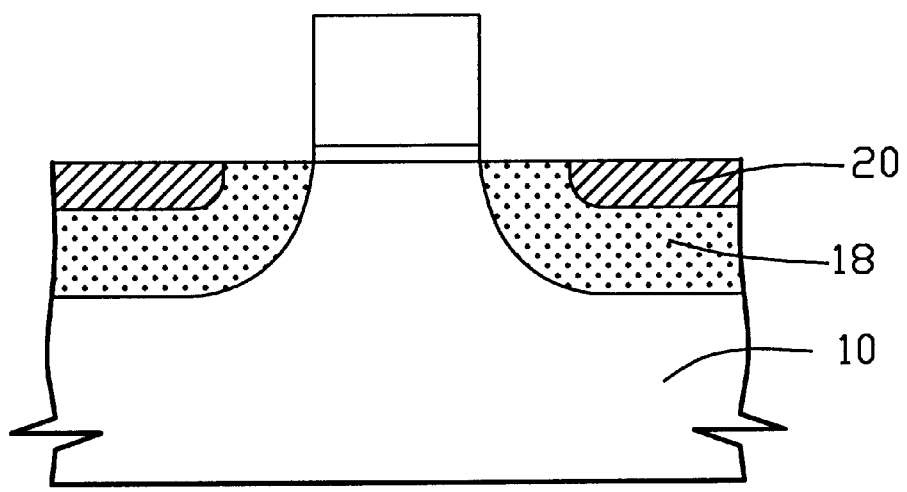

Referring to FIG. 4, N-type ions 18I implants into silicon substrate 10 passing through the triangle shape of high-density plasma CVD film 16 to form the N-type grad 18, wherein the N-type ions 18I are Phosphorous ions and the implanting energy of N-type ions 18I is about 100 to 1000 KeV. Although N-type ions 18I implants into silicon substrate 10 passing through the triangle shape of high-density plasma CVD dielectric film 16, the thickness of the triangle shape of high-density plasma CVD dielectric film 16 is different to result in dissimilar channeling profile by using equivalent implanting energy. Consequentially, the implanting energy of $N^+$-type ions 20I are adjusted in accordance with the thickness of the high-density plasma CVD dielectric film 16, wherein the ions can only penetrate through the flat high-density plasma CVD dielectric film 16 and not the triangle shape high-density plasma CVD film to form source/drain regions 20 inside the N-type grad 18. The implanting energy of $N^+$-type ions 20I is about 100~1000 KeV to form source/drain 20, wherein the implanting energy of the source/drain 20 regions has concentration higher than implanting energy of the grad 18. Then the source/drain 20 implantation can also be operated after grad implantation. The triangle high-density plasma CVD dielectric film can be used as the grad 18 and source/drain 20 implantation mask. Accordingly, the source/drain 20 structure and grad junction 18 structure for high-voltage device requirement can be achieved with this embodiment. For the conventional process method, a photoresist mask process for the source/drain structure formation is proposed. In this one embodiment of the present invention, the grad 20 and source/drain 18 implantation can be applied in the same step, so an offset source/drain mask layer saving process method for high voltage MOS transistor is proposed. Finally, the dielectric layer 16 is removed by dry etching method as shown in FIG. 6.

Although specific embodiments have been illustrated and described, it will be obvious to those skilled in the art that various modifications may be made without departing from what is intended to be limited solely by the appended claims.

What is claimed is:

1. A method for forming a high-voltage MOS device, comprising:

providing a substrate;

forming a gate oxide layer above said substrate;

depositing a polysilicon layer over said gate oxide layer;

forming a photoresist layer over said polysilicon layer and gate oxide layer, wherein said photoresist layer is defined and etched to form a gate;

removing the photoresist layer;

depositing and etching a dielectric layer above said polysilicon layer by using high-density plasma CVD to result in the inherit triangle shape of high-density plasma CVD film characteristic;

implanting first ions into the substrate to form a grad therein;

implanting second ions into said grad to form source/drain regions, wherein said second ions having dosage greater than said first ions.

2. The method according to claim 1, wherein said dielectric layer comprises silicon oxide.

3. The method according to claim 1, wherein said grad is N-type grad.

4. The method according to claim 1, wherein said second ions are $N^+$-type ions.

5. The method according to claim 1, wherein the thickness of said dielectric layer is about 200 to 5000 angstroms.

6. A method for forming a high-voltage MOS device, comprising:

providing a silicon substrate;

forming a gate oxide layer above said silicon substrate;

depositing a polysilicon layer over said gate oxide layer;

forming a photoresist layer over said polysilicon layer and gate oxide layer, wherein said photoresist layer is defined and etched to form a gate;

removing the photoresist layer;

depositing and etching a dielectric layer above said polysilicon layer by using high-density plasma CVD to result in the inherit triangle shape of high-density plasma CVD film characteristic;

implanting N-type ions into the silicon substrate to form N-type grad therein;

implanting $N^+$-type ions into said grad to form source/drain regions.

7. The method according to claim 6, wherein said N-type ions comprises Phosphorus.

8. The method according to claim 6, wherein the implanting energy of said N-type ions is about 100 to 1000 KeV to form N-type grad.

9. The method according to claim 6, wherein said $N^+$-type ions comprises Phosphorus and Arsenic.

10. The method according to claim 9, wherein the implanting energy of said $N^+$-type ions is about 100 to 1000 KeV to form source/drain regions.

11. The method according to claim 6, wherein said implanting ions of said source/drain regions has concentration higher than implanting ions of the grad.

12. The method according to claim 6, wherein said dielectric layer further comprises silicon oxide.

13. The method according to claim 6, wherein the thickness of said dielectric layer is about 200 to 5000 angstroms.

14. A method for forming a high-voltage MOS device, comprising:

providing a silicon substrate; forming a gate oxide layer above said silicon substrate;

depositing a polysilicon layer over said gate oxide layer;

forming a photoresist layer over said polysilicon layer and gate oxide layer, wherein said photoresist layer is defined and etched to form a gate;

removing the photoresist layer;

depositing and etching a dielectric layer above said polysilicon layer by using high density plasma CVD to result in the inherit triangle shape of high-density plasma CVD film characteristic;

implanting first ions into the substrate to form a grad therein by using said high-density plasma dielectric layer as a mask;

implanting second ions into said grad to form source/drain regions by using said high-density plasma dielectric layer as a mask, wherein said second ions having dosage greater than said first ions.

* * * * *